(12) United States Patent
Lee

(10) Patent No.: US 12,294,032 B2
(45) Date of Patent: May 6, 2025

(54) SEGMENTED SCHOTTKY DIODE

(71) Applicant: TEXAS INSTRUMENTS INCORPORATED, Dallas, TX (US)

(72) Inventor: Zachary K. Lee, Fremont, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 18/405,053

(22) Filed: Jan. 5, 2024

(65) Prior Publication Data
US 2024/0145602 A1 May 2, 2024

Related U.S. Application Data

(62) Division of application No. 17/137,590, filed on Dec. 30, 2020, now Pat. No. 11,916,152.

(51) Int. Cl.
*H01L 29/872* (2006.01)
*H01L 29/06* (2006.01)
*H01L 29/47* (2006.01)

(52) U.S. Cl.
CPC ........ *H01L 29/872* (2013.01); *H01L 29/0619* (2013.01); *H01L 29/47* (2013.01)

(58) Field of Classification Search
CPC ... H01L 29/872; H01L 29/0619; H01L 29/47; H01L 29/0692; H01L 29/66143; H01L 21/8222; H01L 21/84; H01L 27/0814; H01L 27/1203; H01L 29/0623; H01L 29/0684
See application file for complete search history.

(56) References Cited

U.S. PATENT DOCUMENTS

| | | | | |
|---|---|---|---|---|
| 2008/0258153 A1* | 10/2008 | Yamamoto | .......... | H01L 29/6606 438/572 |
| 2012/0139079 A1* | 6/2012 | Tokura | ................ | H01L 29/0619 257/471 |
| 2013/0032809 A1* | 2/2013 | Allen | .................... | H01L 29/861 257/E29.338 |
| 2014/0001594 A1* | 1/2014 | Chen | ................. | H01L 29/66143 257/E29.338 |
| 2014/0197422 A1* | 7/2014 | Wada | .................. | H01L 29/0619 257/77 |
| 2019/0140071 A1* | 5/2019 | Mun | ...................... | H01L 29/872 |
| 2020/0266268 A1* | 8/2020 | Uchida | ............... | H01L 23/3171 |

* cited by examiner

*Primary Examiner* — Khaja Ahmad
*Assistant Examiner* — Khatib A Rahman
(74) *Attorney, Agent, or Firm* — Andrew R. Ralston; Frank D. Cimino

(57) ABSTRACT

A semiconductor device includes a Schottky diode on a silicon-on-insulator (SOI) substrate. The Schottky diode includes a guard ring with a first guard ring segment contacting a barrier region on a first lateral side of the barrier region, and a second guard ring segment contacting the barrier region on a second, opposite, lateral side of the barrier region. The first and second guard ring segments extend deeper in the semiconductor layer than the barrier region. The Schottky diode further includes a drift region contacting the barrier region, and may include a buried layer having the same conductivity type as the barrier region, extending at least partway under the drift region. The barrier region is isolated from the substrate dielectric layer of the SOI substrate by an isolation region having the same conductivity type as the guard ring. A metal containing layer is formed on the barrier region.

20 Claims, 9 Drawing Sheets

SEGMENTED SCHOTTKY DIODE

FIELD

This disclosure relates to the field of semiconductor devices. More particularly, but not exclusively, this disclosure relates to Schottky diodes in semiconductor devices.

BACKGROUND

Some semiconductor devices are made on a silicon-on-insulator (SOI) substrate, which offers a platform where the breakdown voltage can be extended easily by increasing the lateral dimensions. Schottky diodes on SOI substrates that operate above 60 volts are challenging, in part due to bias effects from the handle wafer of the SOI substrate.

SUMMARY

The present disclosure introduces a semiconductor device including a Schottky diode on a silicon-on-insulator (SOI) substrate that includes a semiconductor layer on a substrate dielectric layer. The Schottky diode includes a guard ring having a first conductivity type in the semiconductor layer. The Schottky diode includes a drift region having a second, opposite, conductivity type in the semiconductor layer, a Schottky barrier region having the second conductivity type in the semiconductor layer, contacting the drift region, and a metal-containing layer contacting the Schottky barrier region. A barrier of the Schottky diode is formed at an interface between the Schottky barrier region and the metal-containing layer. The guard ring includes a first guard ring segment contacting the Schottky barrier region on a first lateral side of the barrier region, and a second guard ring segment contacting the Schottky barrier region on a second, opposite, lateral side of the Schottky barrier region.

DETAILED DESCRIPTION

Figure 1:
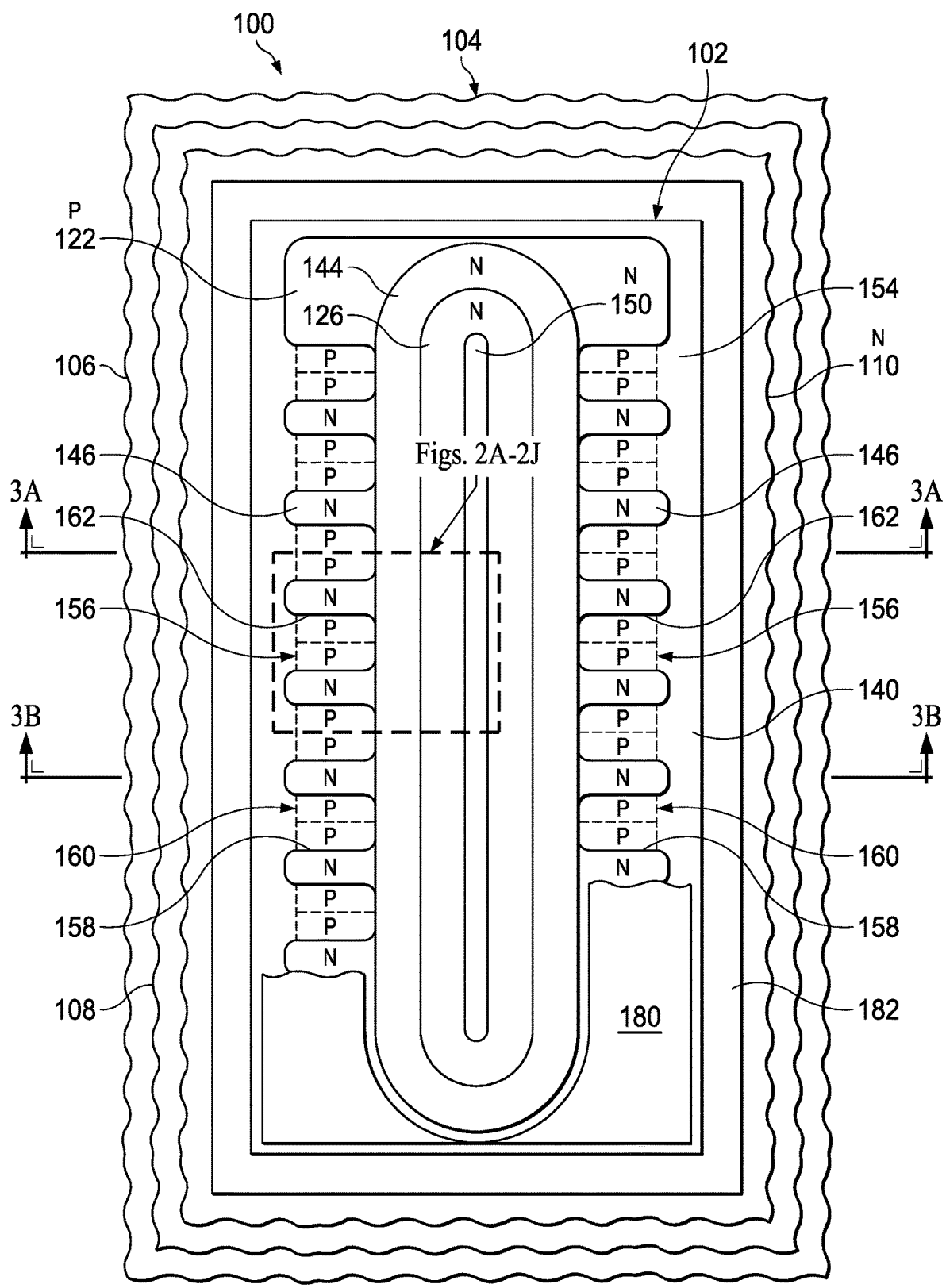
FIG. 1 is a top view of an example semiconductor device including a Schottky diode on an SOI substrate.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A semiconductor device is formed on a silicon-on-insulator (SOI) substrate. The SOI substrate includes a substrate dielectric layer, and a semiconductor layer on the substrate dielectric layer. The semiconductor layer has a bottom surface at a boundary between the semiconductor layer and the substrate dielectric layer, and a top surface located opposite the bottom surface. The semiconductor device includes a Schottky diode in and on the semiconductor layer.

The Schottky diode includes a guard ring in the semiconductor layer, having a first conductivity type in the semiconductor layer. The Schottky diode includes a drift region in the semiconductor layer having a second, opposite, conductivity type, and a Schottky barrier region in the semiconductor layer having the second conductivity type, contacting the drift region. The Schottky barrier region is referred to as the barrier region in this disclosure, for brevity. The Schottky diode includes a metal-containing layer contacting the barrier region. The metal-containing layer may be manifested as a metal silicide layer. A barrier of the Schottky diode is formed at an interface between the barrier region and the metal-containing layer. The guard ring includes a first guard ring segment contacting the barrier region on a first lateral side of the barrier region, and a second guard ring segment contacting the barrier region on a second, opposite, lateral side of the barrier region. The term "lateral side" refers to a side that is perpendicular to a plane of the bottom surface of the semiconductor layer.

The Schottky diode may include a drift buried layer having the second conductivity type in the semiconductor layer. The drift buried layer is between the substrate dielectric layer and the drift region, and extends laterally along at least a portion of the drift region. The drift buried layer may have an average net concentration of second conductivity type dopants higher than the drift region, or lower than the drift region.

In versions of the Schottky diode in which the second conductivity type is n-type, the metal-containing layer provides an anode of the Schottky diode, and the barrier region is part of a cathode of the Schottky diode. In versions of the Schottky diode in which the second conductivity type is p-type, the metal-containing layer provides a cathode of the Schottky diode, and the barrier region is part of an anode of the Schottky diode.

The term "first conductivity type dopants" and the term "second conductivity type dopants" refer to dopants which provide the first conductivity type and dopants which provide the second conductivity type, respectively, in a semiconductor material. For example, for a case in which the first conductivity type is p-type and the second conductivity type is n-type, boron, gallium, and indium are first conductivity type dopants, as they provide p-type conductivity in the semiconductor material, and phosphorus, arsenic, and antimony are second conductivity type dopants, as they provide n-type conductivity in the semiconductor material. The term "average net concentration of second conductivity type dopants" refers to an average concentration of second conductivity type dopants minus an average concentration of first conductivity type dopants. The average net concentration of second conductivity type dopants in a semiconductor region is related to an electrical conductivity in the semiconductor region. Similarly, the term "average net concentration of first conductivity type dopants" refers to an average concentration of first conductivity type dopants minus an average concentration of second conductivity type dopants.

When two semiconductor regions are disclosed as having equal average net concentrations of first (or second) conductivity type dopants, the average net concentrations are understood to be equal within tolerances normally encountered in fabrication process, such as ion implantation, used to form the two semiconductor regions; thus the average net concentrations may be equal within 5 percent. The average net concentrations may be estimated from a cross section sample of the semiconductor regions by measuring impedances of the semiconductor regions using scanning capacitance microscopy (SCM) or scanning microwave impedance microscopy (SMIM). Estimates of the average net concentrations may differ by an amount within tolerances encountered in the SCM and SMIM methods, which may be less than 10 percent.

It is noted that terms such as top, bottom, over, above, and under may be used in this disclosure. These terms should not be construed as limiting the position or orientation of a structure or element, but should be used to provide spatial relationship between structures or elements.

FIG. 1 is a top view of an example semiconductor device 100 including a Schottky diode 102 on an SOI substrate 104. The Schottky diode 102 includes a plurality of junction segments. In this example, the SOI substrate 104 may include a handle wafer 106, a substrate dielectric layer 108 on the handle wafer 106, and a semiconductor layer 110 on the substrate dielectric layer 108. The semiconductor device 100 is depicted in FIG. 1 with some parts removed, such as field oxide and field plates, to show spatial relationships more clearly between remaining parts of the Schottky diode 102. The semiconductor layer 110 has a bottom surface at a boundary between the semiconductor layer 110 and the substrate dielectric layer 108; the bottom surface is out of the plane of FIG. 1. The semiconductor layer 110 has a top surface, located opposite from the bottom surface; the top surface is also out of the plane of FIG. 1. This example describes the Schottky diode 102 having an n-type barrier region 146. A Schottky diode having a p-type barrier region may be attained with appropriate changes of polarities of dopants.

The Schottky diode 102 of this example is laterally isolated by an isolation structure 182 which surrounds the Schottky diode 102, and a field oxide 140 that connects to the isolation structure 182. The isolation structure 182 may include silicon dioxide or other dielectric material.

The Schottky diode 102 may optionally include a screen layer 122 in the semiconductor layer 110. The screen layer 122 has the first conductivity type, p-type in this example. The screen layer 122 extends from the bottom surface partway in the semiconductor layer 110 toward the top surface.

The Schottky diode 102 includes a drift well 150 in the semiconductor layer 110. The drift well 150 has a second conductivity type, opposite from the first conductivity type. In this example, the second conductivity type is n-type. The drift well 150 may extend continuously along a length of the Schottky diode 102, as depicted in FIG. 1, which may advantageously reduce a resistance of the Schottky diode 102. Alternatively, the drift well 150 may be manifested as a plurality of separate drift well segments along the center of the Schottky diode 102, which may advantageously reduce current crowding in the Schottky diode 102.

The Schottky diode 102 includes a drift region 144 in the semiconductor layer 110, surrounding the drift well 150. The drift region 144 has the second conductivity type, n-type in this example. The drift region 144 has a lower average net concentration of second conductivity type dopants than the drift well 150. The Schottky diode 102 includes a drift buried layer 126 in the semiconductor layer 110, between the drift well 150 and the bottom surface, and extending laterally partway under the drift well 150, between the drift region 144 and the bottom surface. The drift buried layer 126 has the second conductivity type, n-type in this example. The screen layer 122 extends laterally partway under the drift well 150, between the drift region 144 and the bottom surface, contacting the drift buried layer 126 around a perimeter of the drift buried layer 126.

The Schottky diode 102 further includes a guard ring 154 in the semiconductor layer 110, between the drift region 144 and the isolation structure 182. The guard ring 154 has the first conductivity type, p-type in this example. The guard ring 154 has an average net concentration of first conductivity type dopants higher than the screen layer 122. The guard ring 154 includes first guard ring segments 156 and second guard ring segments 160.

The Schottky diode 102 includes the barrier region 146 in the semiconductor layer 110. The barrier region 146 has the second conductivity type, n-type in this example. The barrier region 146 of this example is segmented, having segments, or fingers, of the barrier region 146 that extend from the drift region 144 between instances of the first guard ring segments 156 and the second guard ring segments 160. Each segment of the barrier region 146 has one of the first guard ring segments 156 contacting that segment on a first lateral side 158 of the segment, and has one of the second guard ring segments 160 contacting that segment on a second lateral side 162 of the segment located opposite from the first lateral side 158. The first guard ring segments 156 and the second guard ring segments 160 extend deeper into the semiconductor layer 110, from the top surface, than the barrier region 146. The first guard ring segments 156 and the second guard ring segments 160 have average net concentrations of first conductivity type dopants that are at least 5 times higher than an average net concentration of second conductivity type dopants of the barrier region 146.

The barrier region 146 does not extend to the bottom surface of the semiconductor layer 110. Semiconductor material between the barrier region 146 and the bottom surface has the first conductivity type, with an average net concentration of first conductivity type dopants that is less than the average net concentrations of first conductivity type dopants of the first guard ring segments 156 and the second guard ring segments 160. The screen layer 122 may provide a portion or all of the semiconductor material between the barrier region 146 and the bottom surface.

The Schottky diode 102 has metal silicide 180 on the guard ring 154 and the barrier region 146. The metal silicide 180 may optionally extend partially onto the drift region 144, but does not extend onto the drift buried layer 126 or onto the drift well 150.

The linear configuration of the Schottky diode 102 may advantageously enable scaling the Schottky diode 102 by extending lengths of the barrier region 146 and the drift region 144, and correspondingly increasing instances of the first guard ring segments 156 and the second guard ring segments 160, to attain a desired on-state current through the Schottky diode 102 during operation of the semiconductor device 100.

Figure 2A:
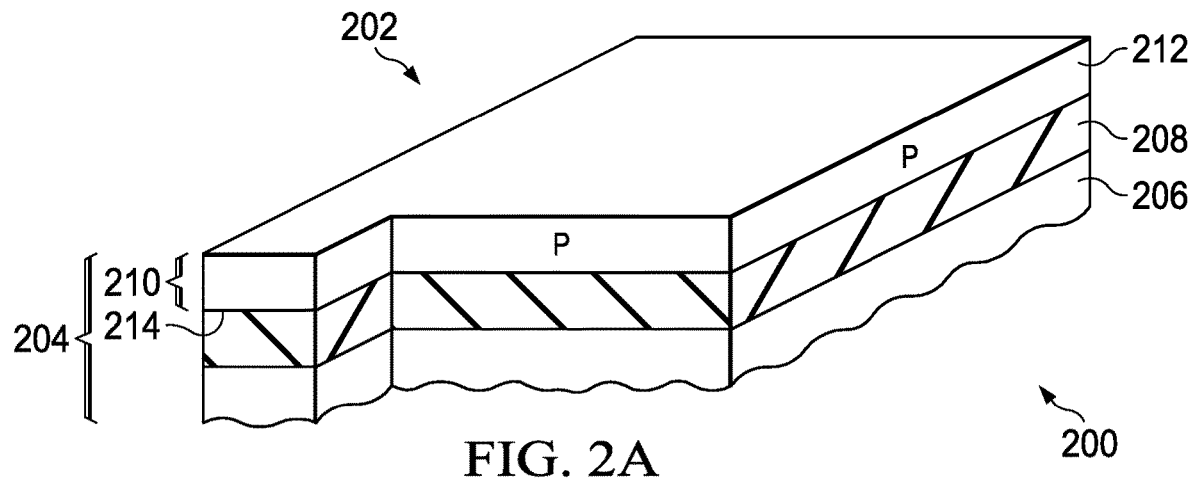
FIG. 2A through FIG. 2J are cross sections of an example semiconductor device including a Schottky diode on an SOI substrate, depicted in stages of an example method of formation.

FIG. 2A through FIG. 2J are cross sections of an example semiconductor device 200 including a Schottky diode 202 on an SOI substrate 204, depicted in stages of an example method of formation. For reference, a portion of the Schottky diode 100 is outlined that corresponds to the illustrated Schottky diode 202. Referring to FIG. 2A, the semiconductor device 200 is formed on the SOI substrate 204. In this example, the SOI substrate 204 may include a handle wafer 206, a substrate dielectric layer 208 on the handle wafer 206, and a semiconductor layer 210 on the substrate dielectric layer 208. The handle wafer 206 may be electrically conductive, and may include monocrystalline silicon, or other material suitable for semiconductor fabrication processing, and may be 400 microns to 800 microns thick, by way of example, to support the substrate dielectric layer 208 and the semiconductor layer 210. The substrate dielectric layer 208 may include silicon dioxide, aluminum oxide (sapphire), or other dielectric material, and may be 1 micron to 10 microns thick, for example, to electrically isolate the semiconductor layer 210. In an alternate version of this example, the handle wafer 206 may be omitted, and the substrate dielectric layer 208 may be 400 microns to 800 microns thick, providing the support functionality of the handle wafer 206.

The semiconductor layer 210 may be monocrystalline, and may include silicon, silicon with germanium, silicon with carbon, or silicon carbide. Other semiconductor materials for the semiconductor layer 210 are within the scope of this example. In this example, the semiconductor layer 210 includes a first semiconductor sublayer 212 directly on the substrate dielectric layer 208. Additional semiconductor material of the semiconductor layer 210 will be formed in subsequent fabrication operations. The semiconductor layer 210 has a bottom surface 214 at a boundary between the semiconductor layer 210 and the substrate dielectric layer 208. The first semiconductor sublayer 212 may be 1 micron to 2 microns thick, by way of example. The first semiconductor sublayer 212 has a first conductivity type, which is p-type in this example. The first semiconductor sublayer 212 may have an average concentration of first conductivity type dopants of $1 \times 10^{14}$ cm$^{-3}$ to $1 \times 10^{17}$ cm$^{-3}$, by way of example.

Figure 2B:
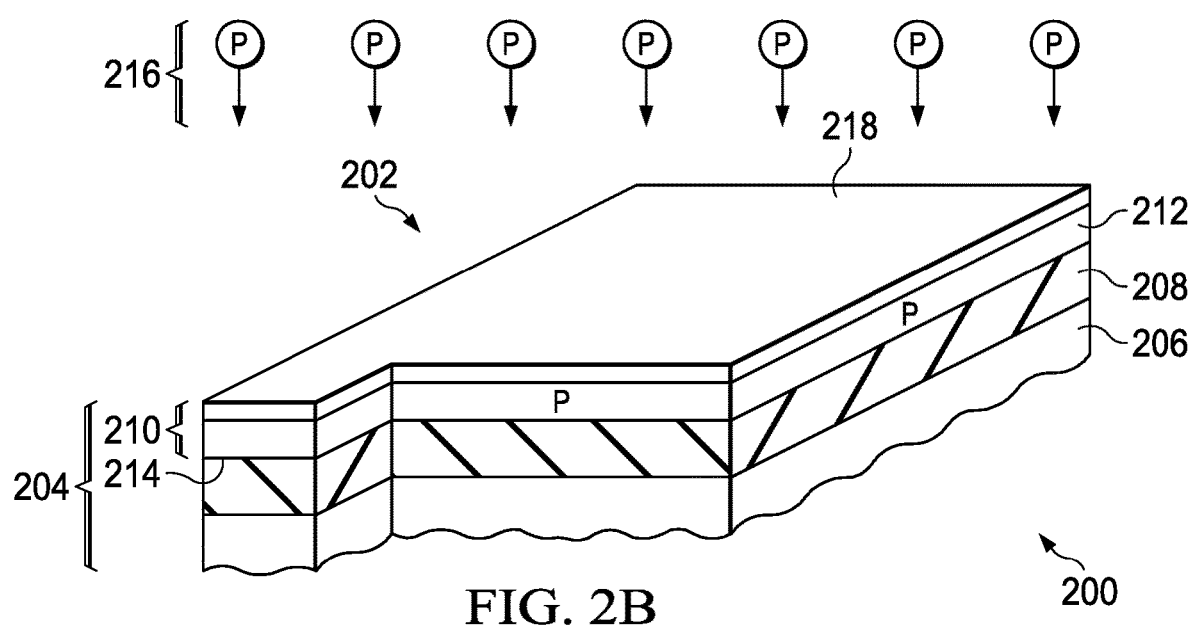

Referring to FIG. 2B, a protective layer of silicon dioxide, not shown, may be formed over the first semiconductor sublayer 212. An optional first dose of first conductivity type dopants 216 may be introduced into the first semiconductor sublayer 212, to form a first implanted region 218 in the first semiconductor sublayer 212. The first dose of the first conductivity type dopants 216 may include boron, to facilitate subsequent diffusion in the first semiconductor sublayer 212. The first dose of the first conductivity type dopants 216 may be introduced at a total dose of $1 \times 10^{11}$ cm$^{-2}$ to $1 \times 10^{13}$ cm$^{-2}$, by way of example. The first dose of the first conductivity type dopants 216 may be introduced by a beamline ion implant process, by a doped oxide process, by a plasma ion implant process, or by another process. In this example, the first dose of the first conductivity type dopants 216 may be introduced across the SOI substrate 204, as indicated in FIG. 2B. Alternatively, the first dose of the first conductivity type dopants 216 may be introduced into the SOI substrate 204 in specific areas, using an implant mask, for example.

Figure 2C:
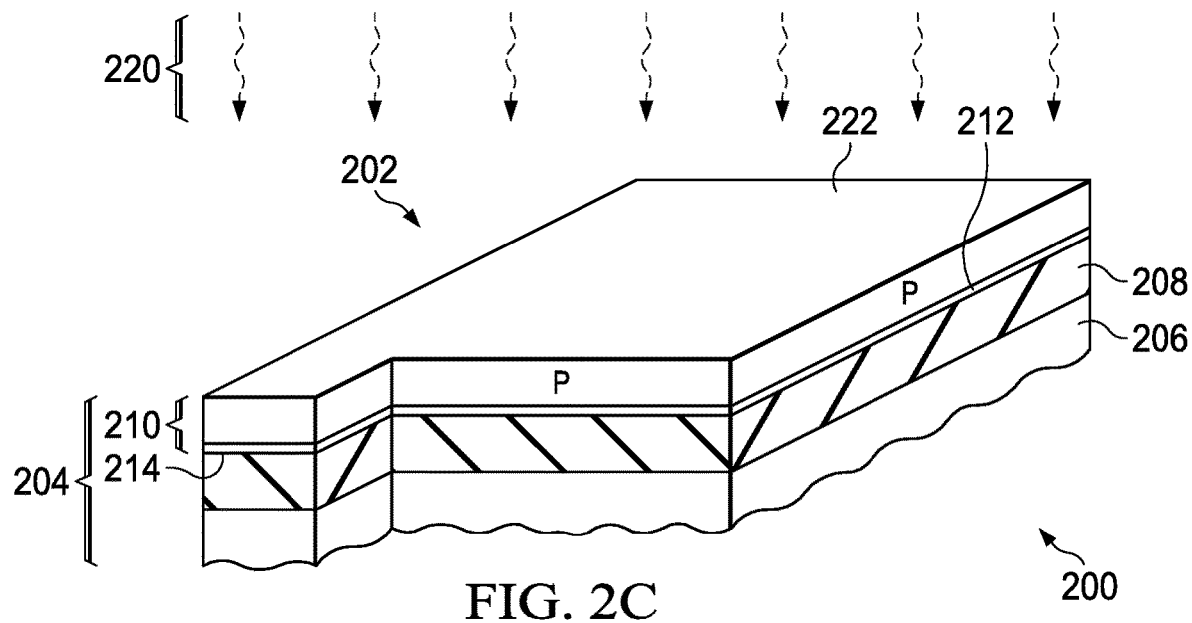

Referring to FIG. 2C, the first semiconductor sublayer 212 is heated by a heating process 220 to diffuse and activate the first conductivity type dopants in the first implanted region 218 of FIG. 2B to form an optional screen layer 222 in the first semiconductor sublayer 212. The heating process 220 may be implemented as a radiative heating process, such as a rapid thermal process, or may be implemented as a furnace heating process. The screen layer 222, if formed, has the first conductivity type, p-type in this example, and may have an average net concentration of first conductivity type dopants of $1 \times 10^{15}$ cm$^{-3}$ to $1 \times 10^{17}$ cm$^{-3}$, by way of example, to prevent inversion by a potential difference between the semiconductor layer 210 and the handle wafer 206 during operation of the Schottky diode 202. The screen layer 222 may extend partway to the substrate dielectric layer 208, with a portion of the first semiconductor sublayer 212 remaining between the screen layer 222 and the substrate dielectric layer 208, as indicated in FIG. 2C. Alternatively, the screen layer 222 may extend to the substrate dielectric layer 208. In an alternate version of this example, the heating process 220 may be omitted, and the first semiconductor sublayer 212 may be heated after implanting second conductivity type dopants for a subsequently-formed drift buried layer 226, shown in FIG. 2E.

Figure 2D:
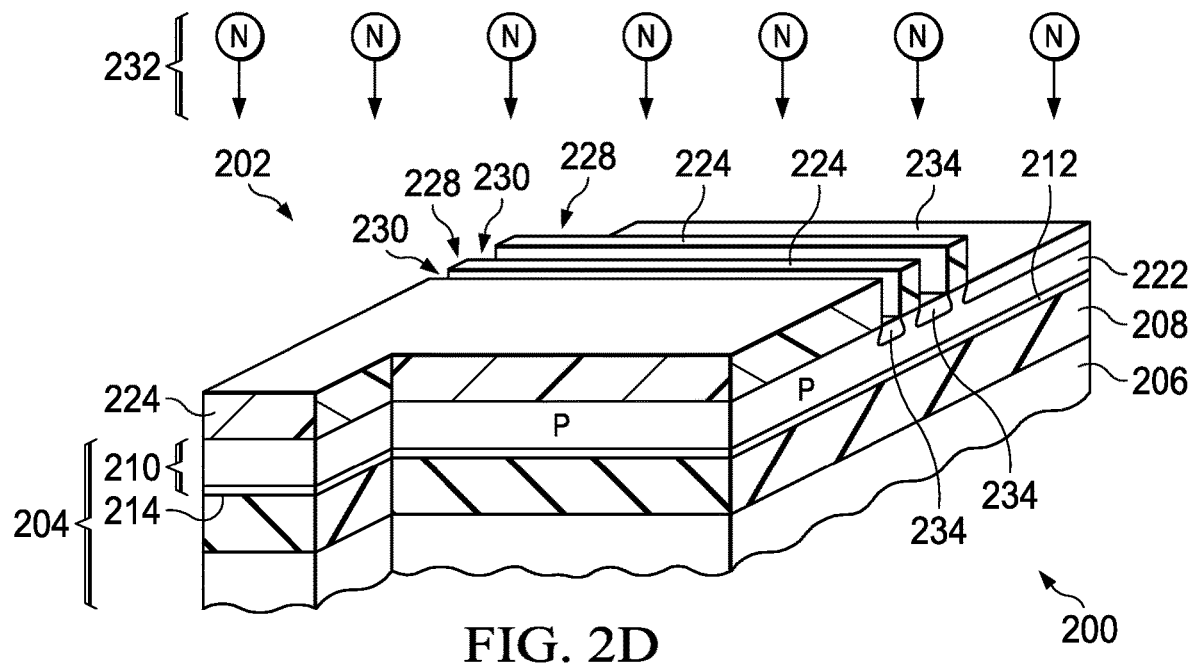

Referring to FIG. 2D, a buried layer mask 224 may be formed over the first semiconductor sublayer 212. The buried layer mask 224 exposes the first semiconductor sublayer 212 in an area for the subsequently-formed drift buried layer 226, shown in FIG. 2E, of the Schottky diode 202. The buried layer mask 224 may include photoresist, and may be formed by a photolithographic process. Alternatively, the buried layer mask 224 may include hard mask material, such as silicon dioxide. In this example, the buried layer mask 224 may have a segmented configuration, with narrow stripes 228 separated by narrow spaces 230, along an edge of the area for the subsequently-formed drift buried layer 226 facing a subsequently-formed barrier region 246, shown in FIG. 2G, to dilute a dopant density at the edge of the subsequently-formed drift buried layer 226, providing a dopant density gradient. In one version of this example, the narrow stripes 228 and narrow spaces 230 may have widths that are 0.5 microns to 2 microns wide, for example. In another version, the narrow stripes 228 and narrow spaces 230 may have widths that are 25 percent the thickness of the first semiconductor sublayer 212 to 150 percent the thickness of the first semiconductor sublayer 212.

A first dose of second conductivity type dopants 232 may be introduced into the first semiconductor sublayer 212 where exposed by the buried layer mask 224, to form second implanted regions 234 in the first semiconductor sublayer 212. The first dose of the second conductivity type dopants may include arsenic, antimony, phosphorus, or a combination thereof, and may be implanted at a total dose of $1 \times 10^{11}$ cm$^{-2}$ to $1 \times 10^{14}$ cm$^{-2}$, by way of example. The total dose of the first dose of the second conductivity type dopants 232 is greater than the total dose of the first conductivity type dopants 216, of FIG. 2B, used to form the screen layer 222, for example, 1.5 times to 10 times greater. Phosphorus in the first dose of the second conductivity type dopants may be implanted at one or more implant energies, from 50 keV to 1460 keV.

The buried layer mask 224 is removed after the first dose of the second conductivity type dopants 232 is introduced. Photoresist in the buried layer mask 224 may be removed by a plasma process with oxygen radicals, exposure to ozone, or a wet etch process using an aqueous mixture of sulfuric acid and hydrogen peroxide. Silicon dioxide in the buried layer mask 224 may be removed by a dilute (0.1 percent to 5 percent) buffered aqueous solution of hydrofluoric acid.

The first semiconductor sublayer 212 may be heated to diffuse the first dose of the second conductivity type dopants 232 in the second implanted regions 234 further into the first semiconductor sublayer 212. In versions of this example in which the buried layer mask 224 includes hard mask material, the first semiconductor sublayer 212 may optionally be heated before the buried layer mask 224 is removed.

Figure 2E:
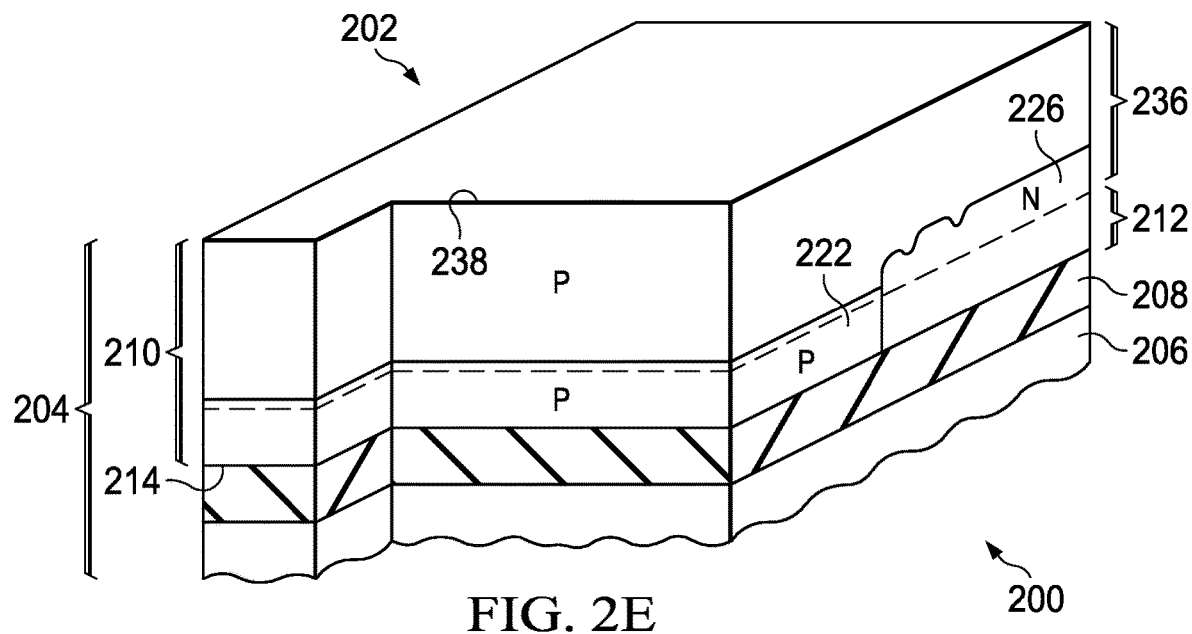

Referring to FIG. 2E, a second semiconductor sublayer 236 of the semiconductor layer 210 is formed on the first semiconductor sublayer 212. The second semiconductor sublayer 236 may be formed by an epitaxial process that includes thermal decomposition of silane, for example. The second semiconductor sublayer 236 may have a composition similar to the first semiconductor sublayer 212. The second semiconductor sublayer 236 may be 2 microns to 8 microns thick. The semiconductor layer 210 may have a total thickness of 3 microns to 10 microns. The first semiconductor sublayer 212 and the second semiconductor sublayer 236 are heated during the process of forming the second semiconductor sublayer 236, which may result in the first dose of second conductivity type dopants 232, of FIG. 2D, in the second implanted regions 234 of FIG. 2D, diffusing into the first semiconductor sublayer 212 and the second semiconductor sublayer 236 to form the drift buried layer 226 of the Schottky diode 202. The drift buried layer 226 has the second conductivity type, n-type in this example. The drift buried layer 226 may have a dopant density gradient such that a concentration of second conductivity type dopants in the drift buried layer decreases toward the subsequently-formed barrier region 246, shown in FIG. 2F. The dopant concentration may decrease over a lateral distance that is at least twice a thickness of the drift buried layer 226. The first conductivity dopants in the screen layer 222 may diffuse into the first semiconductor sublayer 212 and to the substrate dielectric layer 208, as indicated in FIG. 2E.

The second semiconductor sublayer 236 extends to a top surface 238 of the semiconductor layer 210. The top surface 238 is located opposite from the bottom surface 214 of the semiconductor layer 210.

Figure 2F:
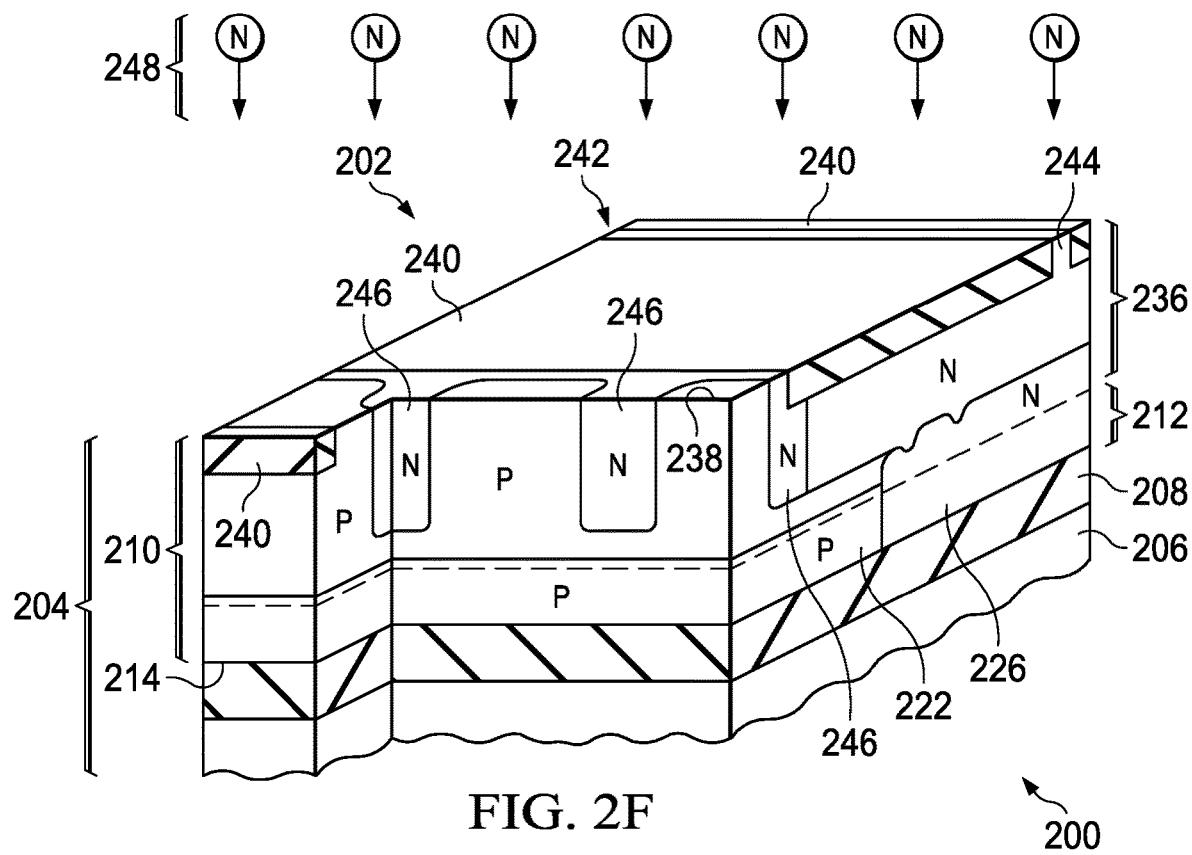

Referring to FIG. 2F, field oxide 240 is formed on the Schottky diode 202. The field oxide 240 may have a thickness of 246 nanometers to 1 micron, by way of example. The field oxide 240 may be formed by a shallow trench isolation (STI) process, in which shallow isolation trenches are formed in the semiconductor layer 210 at the top surface 238, and the isolation trenches are filled with dielectric material such as silicon dioxide. Excess dielectric material is removed from over the top surface 238, leaving the dielectric material in the isolation trenches to provide the field oxide 240. Field oxide 240 formed by the STI process has an STI configuration, in which the isolation trenches have straight sidewalls, and the dielectric material does not extend more than 100 nanometers above the top surface 238. FIG. 2F depicts the field oxide 240 having the STI configuration. Alternatively, the field oxide 240 may be formed by a local oxidation of silicon (LOCOS) process, in which a silicon nitride layer is patterned to expose the top surface 238 in areas for the field oxide 240. The field oxide 240 is formed by thermal oxidation where exposed by the silicon nitride layer, and the silicon nitride layer is subsequently removed. Field oxide 240 formed by the LOCOS process has a LOCOS configuration, with tapered edges, commonly referred to as "birds' beaks". Field oxide 240 formed by the LOCOS process extends above the top surface 238 by about 55 percent of the thickness of the field oxide 240. Other methods for forming the field oxide 240 are within the scope of this example. The field oxide 240 is formed to have a drift active area 242 which exposes the semiconductor layer 210 over a subsequently-formed drift well 250 shown in FIG. 2G.

A drift region 244 and a barrier region 246 are formed in the semiconductor layer 210, above the screen layer 222 and the drift buried layer 226. The drift region 244 and the barrier region 246 have the second conductivity type. The drift region 244 contacts the drift buried layer 226, and extends laterally past the drift buried layer 226. The barrier region 246 contacts the drift region 244.

The drift region 244 may have an average net concentration of second conductivity type dopants of $1\times10^{15}$ cm$^{-3}$ to $5\times10^{17}$ cm$^{-3}$, by way of example, to attain desired values for a maximum reverse bias potential and a forward bias resistance of the Schottky diode 202. The barrier region 246 may have an average net concentration of second conductivity type dopants of $1\times10^{15}$ cm$^{-3}$ to $5\times10^{17}$ cm$^{-3}$, by way of example, to attain a desired value for leakage current and forward voltage of the Schottky diode 202. In one version of this example, the drift region 244 and the barrier region 246 may have equal average net concentrations of second conductivity type dopants, as a result of being formed concurrently, which may advantageously reduce fabrication cost and complexity of the semiconductor device 200. In another version, the average net concentrations of second conductivity type dopants may be different, to independently attain desired values of the maximum reverse bias potential and the leakage current.

The drift region 244 and the barrier region 246 may be formed by implanting a second dose of second conductivity type dopants 248 into the semiconductor layer 210, followed by heating the semiconductor layer 210 to activate the second dose of second conductivity type dopants 248. The second dose of second conductivity type dopants 248 may be implanted at a total dose of $1\times10^{12}$ cm$^{-2}$ to $4\times10^{13}$ cm$^{-2}$, by way of example. The second dose of second conductivity type dopants 248 may be blocked in an area for a subsequently-formed guard ring 254, shown in FIG. 2H. The second dose of second conductivity type dopants 248 may be blocked by an implant mask, for example. In one version of this example, the second dose of second conductivity type dopants 248 may be implanted uniformly across the Schottky diode 202, to form the drift region 244 and the barrier region 246 with equal average net concentrations of second conductivity type dopants. In another version, an implant mask used to expose the semiconductor layer 210 in areas for the drift region 244 and the barrier region 246 may have a segmented configuration, as described in reference to the buried layer mask 224 of FIG. 2D, to form the barrier region 246 with a higher average net concentration of second conductivity type dopants than the drift region 244. In a further version, the drift region 244 and the barrier region 246 may be implanted separately.

Figure 2G:
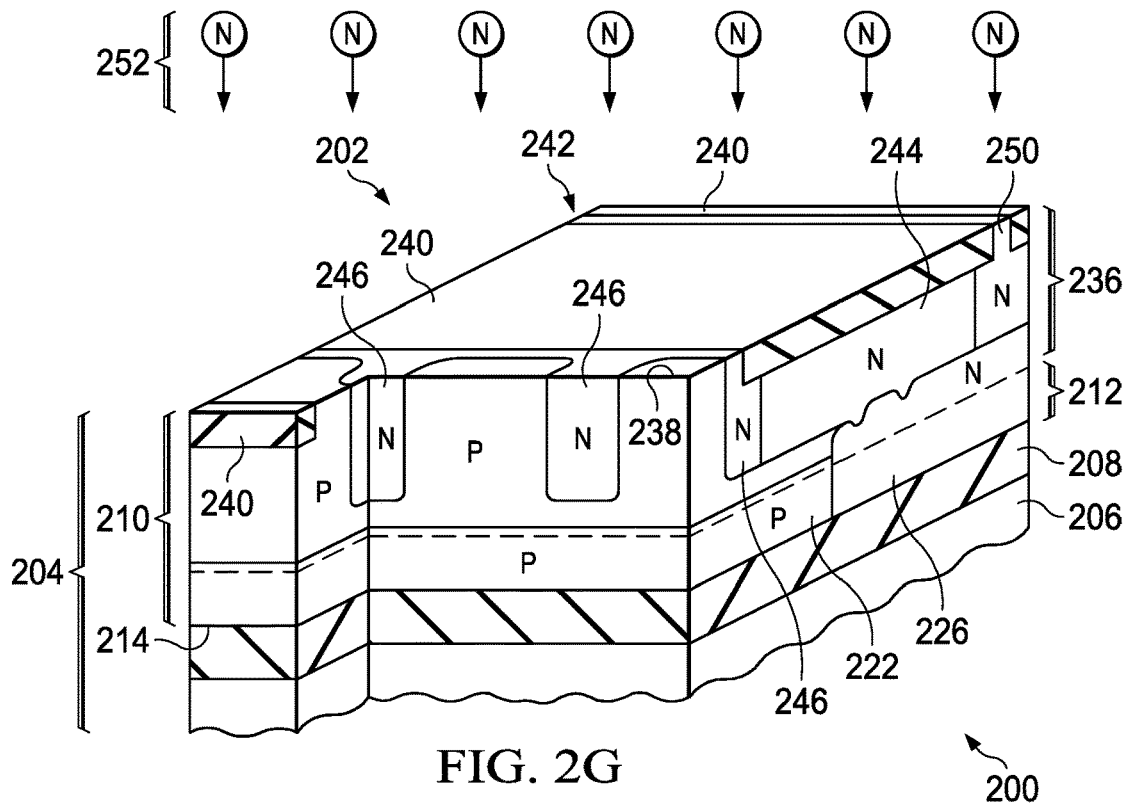

Referring to FIG. 2G, a drift well 250 is formed in the semiconductor layer 210. The drift well 250 has the second conductivity type, n-type in this example. The drift well 250 extends from the top surface 238 of the semiconductor layer 210 to the drift buried layer 226 of the Schottky diode 202. The drift well 250 may be formed by implanting a third dose of second conductivity type dopants 252 into the semiconductor layer 210, followed by heating the semiconductor layer 210 to activate the implanted third dose of second conductivity type dopants 252. The third dose of second conductivity type dopants 252 may include primarily phosphorus, to facilitate diffusion in the semiconductor layer 210 to provide a more uniform dopant distribution than would be obtained with arsenic or antimony. The third dose of second conductivity type dopants 252 may be implanted at a total dose of $1\times10^{12}$ cm$^{-2}$, to $3\times10^{14}$ cm$^{-2}$, to attain an average net concentration of second conductivity type dopants greater than $1\times10^{17}$ cm$^{-3}$, which may advantageously provide low resistance connections to the drift region 244 and the drift buried layer 226. The third dose of second conductivity type dopants 252 may be implanted at two or more implant energies to distribute the third dose of second conductivity type dopants 252 more uniformly in the semiconductor layer 210, compared to implanting at a single implant energy. In an alternate version of this example, drift well 250 may extend into the barrier region 246, to reduce a resistance of the Schottky diode 202.

Figure 2H:
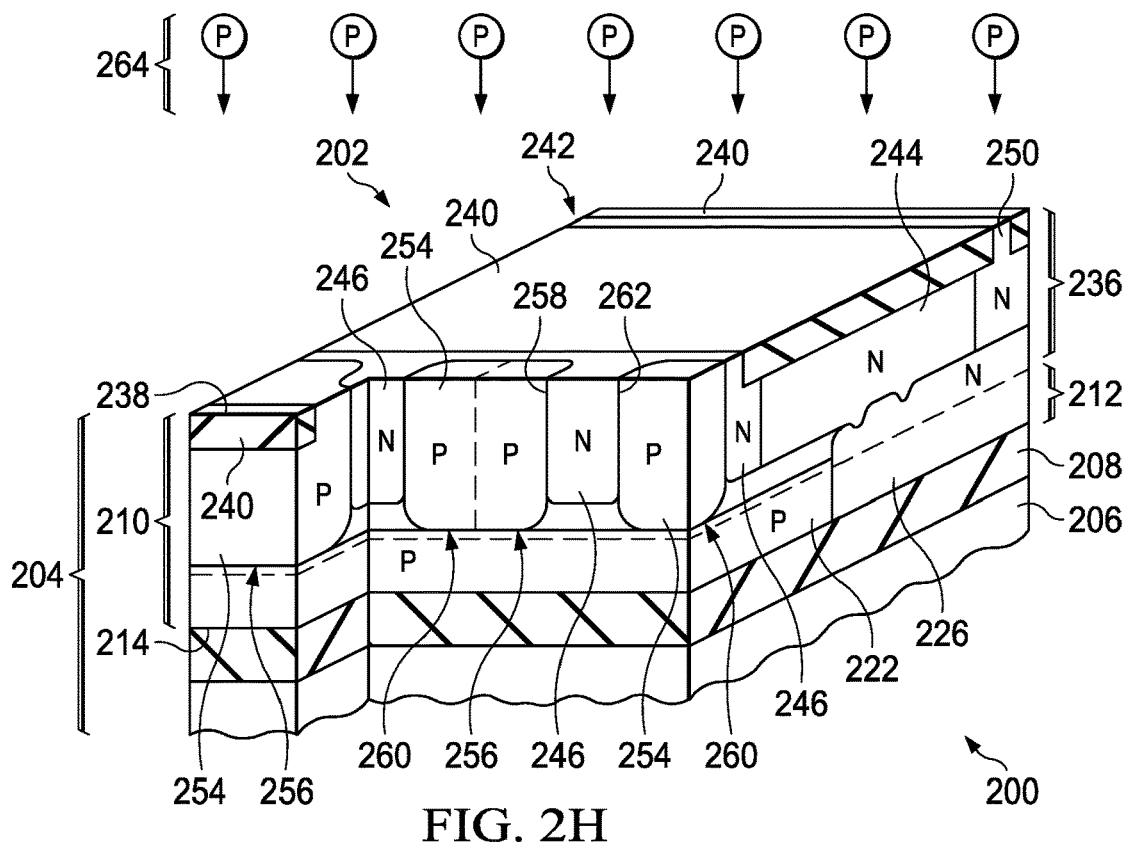

Referring to FIG. 2H, a guard ring 254 is formed in the semiconductor layer 210. The guard ring 254 has the first conductivity type. The guard ring 254 includes first guard ring segments 256 that contact the barrier region 246 on first lateral sides 258 of the barrier region 246. The guard ring 254 further includes second guard ring segments 260 that contact the barrier region 246 on second lateral sides 262 of the barrier region 246. The second lateral sides 262 are located opposite from the first lateral sides 258. The first guard ring segments 256 and the second guard ring segments 260 extend deeper in the semiconductor layer 210 from the top surface 238 than the barrier region 246. Adjacent instances of the first guard ring segments 256 and the second guard ring segments 260 may be contiguous, as depicted in FIG. 2H.

The guard ring 254 has an average net concentration of first conductivity type dopants that is at least 5 times higher than the average net concentration of second conductivity type dopants of the barrier region 246, to provide effective control of conductivity in the barrier region 246. The guard ring 254 may have an average net concentration of first conductivity type dopants of $1 \times 10^{17}$ cm$^{-3}$ to $1 \times 10^{18}$ cm$^{-3}$, by way of example. The average net concentration of first conductivity type dopants of the guard ring 254 is higher than the average net concentration of first conductivity type dopants of the screen layer 222 under the barrier region 246, which may advantageously provide more linearity of on-state current through the Schottky diode 202 as a function of bias on the guard ring 254 compared to a comparable device with a higher first conductivity type dopant concentration in the semiconductor layer 210 under the barrier region 246.

The guard ring 254 may be formed by implanting a second dose of first conductivity type dopants 264 into the semiconductor layer 210 using a well mask, not shown, followed by heating the semiconductor layer 210 to activate the second dose of first conductivity type dopants 264. The second dose of first conductivity type dopants 264 may include primarily boron to provide a more uniform dopant distribution in the guard ring 254. The second dose of first conductivity type dopants 264 may be implanted at several energies to distribute the second dose of first conductivity type dopants 264 in the vertically in the semiconductor layer 210, at a total dose of $3 \times 10^{13}$ cm$^{-2}$ to $4 \times 10^{14}$ cm$^{-2}$, by way of example. One or more wells, not shown, may be formed concurrently with the guard ring 254, to provide body regions for metal oxide semiconductor (MOS) transistors, not shown.

Figure 2I:
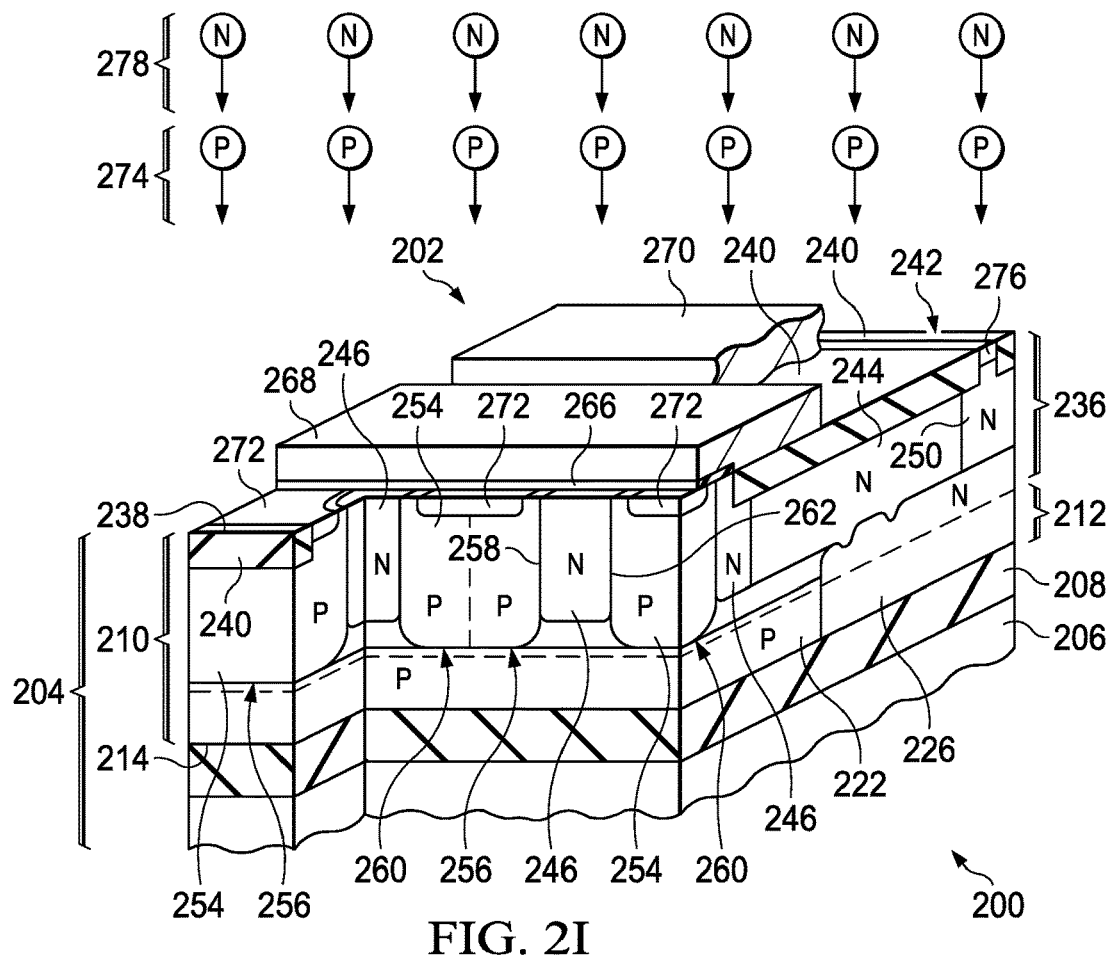

Referring to FIG. 2I, a gate dielectric layer 266 is formed on the semiconductor layer 210, extending partway over the guard ring 254 and the barrier region 246. The gate dielectric layer 266 may be a part of metal oxide semiconductor (MOS) transistors, not shown, in the semiconductor device 200. The gate dielectric layer 266 may be formed by a thermal oxidation process, by way of example.

A barrier-side field plate 268 and a drift-side field plate 270 may be formed over the field oxide 240 and the gate dielectric layer 266. The barrier-side field plate 268 and the drift-side field plate 270 are electrically conductive. The barrier-side field plate 268 extends from the guard ring 254 and barrier region 246 partway over the drift region 244. The barrier-side field plate 268 is separated from the semiconductor layer 210 by the field oxide 240 and the gate dielectric layer 266. The drift-side field plate 270 extends from the drift active area 242 partway over the drift region 244. The drift-side field plate 270 is separated from the semiconductor layer 210 by the field oxide 240. The barrier-side field plate 268 and the drift-side field plate 270 may include polycrystalline silicon, commonly referred to as polysilicon, for example. Other electrically conductive materials for the barrier-side field plate 268 and the drift-side field plate 270, such as aluminum or titanium nitride, are within the scope of this example. The barrier-side field plate 268 and the drift-side field plate 270 may be formed concurrently with gates of the MOS transistors. The barrier-side field plate 268 and the drift-side field plate 270 may each be formed to have contiguous configurations, or may be formed to have segmented configurations. Segmented configurations may provide more effective reduction of electric fields in the drift region 244 during operation of the Schottky diode 202.

A guard ring contact region 272 is formed in the semiconductor layer 210 where exposed by the field oxide 240 and the barrier-side field plate 268, contacting the guard ring 254. The guard ring contact region 272 has the first conductivity type, and has an average net concentration of first conductivity type dopants higher than the guard ring 254, to provide a low resistance connection to the guard ring 254. The guard ring contact region 272 may be formed by implanting a third dose of first conductivity type dopants 274 into the semiconductor layer 210, followed by heating the semiconductor layer 210 to activate the third dose of first conductivity type dopants 274. The third dose of first conductivity type dopants 274 may include boron, indium, and gallium.

A drift contact region 276 is formed in the semiconductor layer 210, in the drift active area 242, contacting the drift well 250. The drift contact region 276 has the second conductivity type, and has an average net concentration of second conductivity type dopants higher than the drift well 250, to provide a low resistance connection to the drift well 250. The drift contact region 276 may be formed by implanting a fourth dose of second conductivity type dopants 278 into the semiconductor layer 210, followed by heating the semiconductor layer 210 to activate the fourth dose of second conductivity type dopants 278. The fourth dose of second conductivity type dopants 278 may include phosphorus, arsenic, and, antimony. The semiconductor layer 210 may be heated to concurrently activate the third dose of first conductivity type dopants 274 and the fourth dose of second conductivity type dopants 278.

Figure 2J:
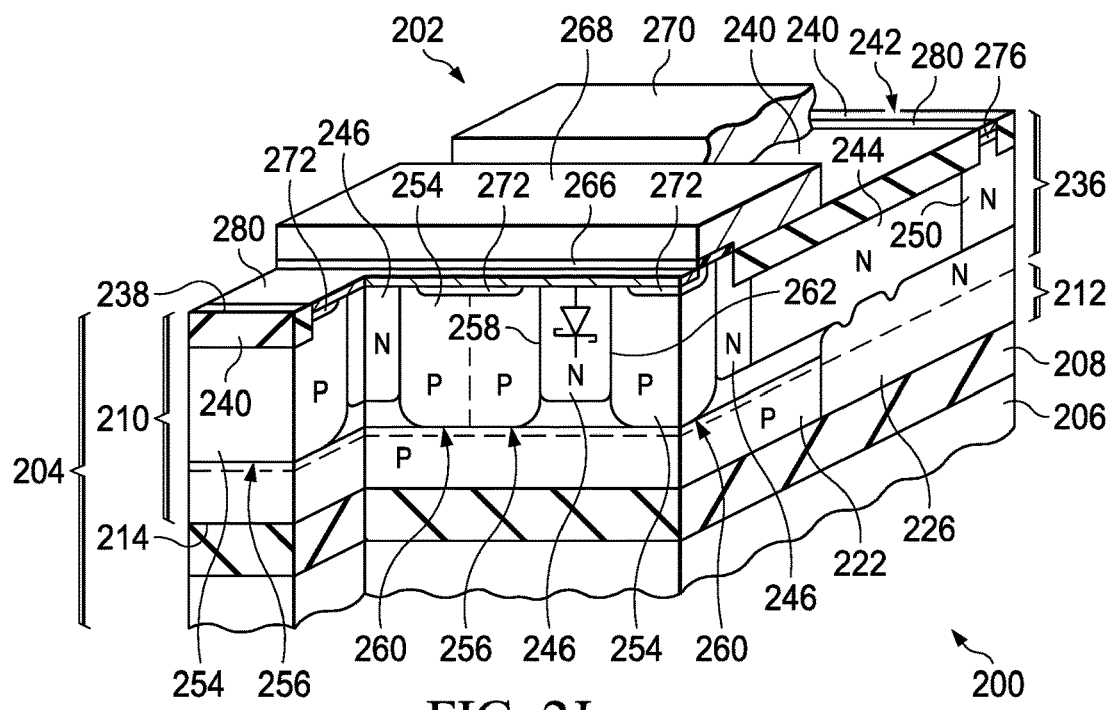

Referring to FIG. 2J, metal silicide 280 is formed on the guard ring contact region 272, on the drift contact region 276, and on the barrier region 246. The metal silicide 280 may include titanium silicide, cobalt silicide, or nickel silicide, by way of example. The metal silicide 280 may be formed by forming a layer of metal on the semiconductor device 200, contacting the guard ring contact region 272, the barrier region 246, and the drift contact region 276. Subsequently, the semiconductor layer 210 is heated to react the layer of metal with silicon in the guard ring contact region 272, the barrier region 246, and the drift contact region 276, forming the metal silicide 280. In versions of this example in which the barrier-side field plate 268 and the drift-side field plate 270 include polysilicon, the metal silicide 280 may be formed on barrier-side field plate 268 and the drift-side field plate 270. Unreacted metal is removed from the semiconductor device 200, leaving the metal silicide 280 in place. The unreacted metal may be removed by a wet etch process using an aqueous mixture of sulfuric acid and hydrogen peroxide, or an aqueous mixture of nitric acid and hydrochloric acid, by way of example.

The metal silicide 280 on the barrier region 246 provides a terminal of the Schottky diode 202, shown symbolically in FIG. 2J. In the version of this example depicted in FIG. 2J, in which the second conductivity type is n-type, the metal silicide 280 on the barrier region 246 provides an anode of the Schottky diode 202. In alternate versions of this example, in which the second conductivity type is p-type, the metal silicide 280 on the barrier region 246 provides a cathode of the Schottky diode 202. The metal silicide 280 on the guard ring contact region 272 may advantageously provide a low resistance coupling to the guard ring 254. Similarly, the metal silicide 280 on the drift contact region 276 may advantageously provide a low resistance coupling to the drift region 244. The barrier region 246 is conductively coupled to the drift well 250 via the drift region 244. The drift region and/or the drift well 250 may be regarded as a common cathode of the plurality of Schottky diodes 202 in the semiconductor device 200.

The Schottky diode 202 of this example has an n-type barrier region 246, which provides a cathode of the Schottky diode 202. An alternate Schottky diode with a p-type barrier region, which provides an anode of the Schottky diode, is within the scope of this example, with appropriate changes in polarities of dopants. An optional dopant density gradient in the drift buried layer 226, as disclosed in reference to FIG. 2E, may reduce an electric field in the drift region 244 and enable the Schottky diode 202 to be operated with a higher potential on the drift well 250 compared to a comparable Schottky diode without the dopant density gradient. The screen layer 222, by having an average net concentration of first conductivity type dopants higher than the semiconductor layer 210 between the screen layer 222 and the barrier region 246, may prevent high electric fields in the barrier region 246 that would cause undesired leakage current or breakdown as the handle wafer 206 is biased at high positive or negative voltages during operation of the Schottky diode 202.

A forward voltage and a leakage current of the Schottky diode 202 are determined in part by a lateral separation of the first guard ring segments 256 from the corresponding second guard ring segments 260 across the barrier region 246, enabling desired values of the forward voltage and the leakage current to be attained by appropriate layout of the guard ring 254, and is advantageously insensitive to fabrication process variations encountered in forming the guard ring 254. Increasing the lateral separation of the first guard ring segments 256 from the corresponding second guard ring segments 260 reduces the forward voltage and increases the leakage current. Conversely, reducing the lateral separation increases the forward voltage and reduces the leakage current.

Figure 3A:
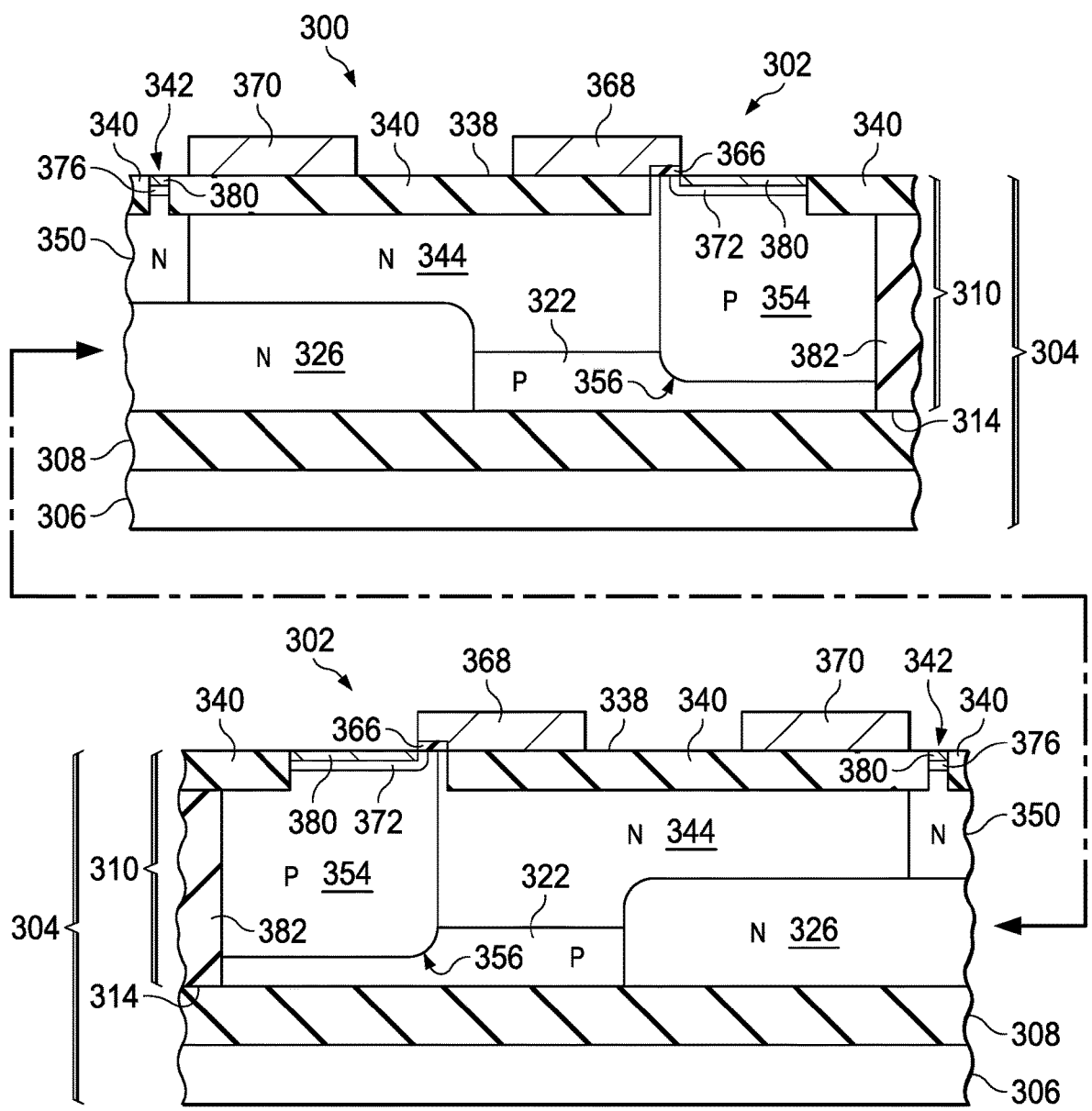
FIG. 3A and FIG. 3B are cross sections of an example semiconductor device including a Schottky diode on an SOI substrate.
Figure 3B:
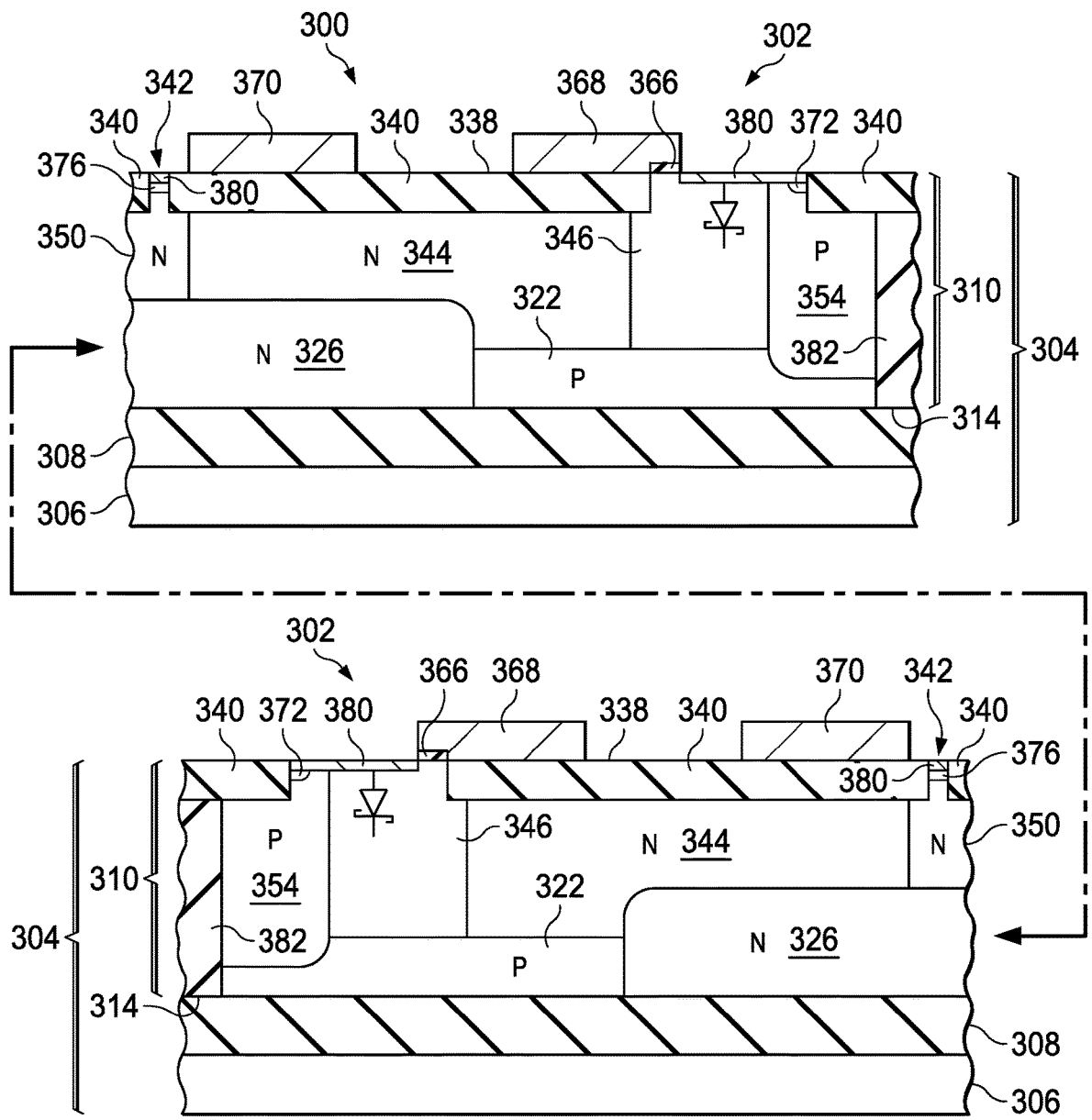

FIG. 3A and FIG. 3B are cross sections of an example semiconductor device 300, analogous to the example semiconductor device 200 depicted in FIG. 2J, including a Schottky diode 302 on an SOI substrate 304. These views are taken at locations of the semiconductor device 300 as shown in the device 100 in FIG. 1. Referring to FIG. 3A, the semiconductor device 300 has an SOI substrate 304, with a handle wafer 306, a substrate dielectric layer 308 on the handle wafer 306, and a semiconductor layer 310 on the substrate dielectric layer 308. The semiconductor layer 310 has a bottom surface 314 at a boundary between the semiconductor layer 310 and the substrate dielectric layer 308. The semiconductor layer 310 has a top surface 338, located opposite from the bottom surface 314.

This example describes the Schottky diode 302 with an n-type drift-centered configuration. A p-type drift-centered version may be attained by appropriate changes in polarities of dopants. The Schottky diode 302 includes a guard ring 354 in the semiconductor layer 310; the guard ring 354 has a first conductivity type, which is p-type in this example. FIG. 3A is a cross section through the guard ring 354. The guard ring 354 includes a first guard ring segment 356 and a second guard ring segment, which is out of the plane of FIG. 3A. The first guard ring segment 356 and the second guard ring segment are configured as disclosed in reference to FIG. 2H and FIG. 2I.

A screen layer 322 is located in the semiconductor layer 310, between the guard ring 354 and the bottom surface 314. The screen layer 322 has the first conductivity type, and has an average net concentration of first conductivity type dopants lower than the guard ring 354.

The Schottky diode 302 includes a drift well 350 in the semiconductor layer 310. The drift well 350 has a second conductivity type, opposite from the first conductivity type. The Schottky diode 302 includes a drift region 344 in the semiconductor layer 310 contacting the drift well 350 on two opposite sides of the drift well 350; the drift region 344 has the second conductivity type. In this example, the second conductivity type is n-type. The Schottky diode 302 includes a barrier region 346, shown in FIG. 3B, in the semiconductor layer 310; the barrier region 346 has the second conductivity type. The barrier region 346 contacts the drift region 344 and extends between the first guard ring segment 356 and the second guard ring segment, as disclosed in reference to FIG. 2H and FIG. 2I. The drift well 350 has an average net concentration of second conductivity type dopants higher than the drift region 344.

The Schottky diode 302 may include a drift buried layer 326 in the semiconductor layer 310, between the bottom surface 314 and the drift region 344, contacting the drift well 350, and extending laterally from the drift well 350 partway under the drift region 344 toward the barrier region 346. The drift buried layer 326 has the second conductivity type. In one version of this example, the drift buried layer 326 may have an average net concentration of second conductivity type dopants higher than the drift region 344. In another version of this example, the drift buried layer 326 may have an average net concentration of second conductivity type dopants lower than the drift region 344. The screen layer 322 extends from the drift buried layer 326, between the bottom surface 314 and the drift region 344.

The Schottky diode 302 includes field oxide 340 over the drift region 344. The semiconductor layer 310 extends through the field oxide 340 in drift active areas 342 located over the drift well 350. A drift contact region 376 in the drift active areas 342 has the second conductivity type with an average net concentration of second conductivity type dopants higher than the drift well 350. Metal silicide 380 may be located on the drift contact region 376.

The Schottky diode 302 includes a guard ring contact region 372 having the first conductivity type, in the semiconductor layer 310, located between the guard ring 354 and the top surface 338 of the semiconductor layer 310, and contacting the guard ring 354. The guard ring contact region 372 has an average net concentration of first conductivity type dopants higher than the guard ring 354. The metal silicide 380 may be located on the guard ring contact region 372.

The Schottky diode 302 may include a barrier-side field plate 368 over the field oxide 340, extending from the guard ring 354 partway over the drift region 344. A gate dielectric layer 366 may isolate the barrier-side field plate 368 from the guard ring contact region 372. The Schottky diode 302 may also include a drift-side field plate 370 over the field oxide 340, extending from the drift active areas 342 partway over the drift region 344.

In this example, the Schottky diode 302 may be laterally isolated by an isolation structure 382 which extends through the semiconductor layer 310 from the bottom surface 314 to the top surface 338. The isolation structure 382 may be manifested as an electrically non-conductive structure, such as a deep trench filled with dielectric material, or as a p-n junction structure, in which isolation is attained by having a p-n junction reverse biased during operation of the semiconductor device 300. The drift-centered configuration of the Schottky diode 302 may provide lower leakage currents and enable higher operating potentials than other configurations.

FIG. 3B is a cross section through the barrier region 346. The drift region 344 extends to the barrier region 346 from the drift well 350. The screen layer 322 extends between the barrier region 346 and the bottom surface 314. The guard ring 354, shown in FIG. 3A, is out of the plane of FIG. 3B.

The metal silicide 380 extends over, and contacts, the barrier region 346, providing a terminal of the Schottky diode 302. In the version of this example depicted in FIG. 3B, in which the second conductivity type is n-type, the metal silicide 380 on the barrier region 346 provides an anode of the Schottky diode 302. In alternate versions of this example, in which the second conductivity type is p-type, the metal silicide 380 on the barrier region 346 provides a cathode of the Schottky diode 302.

Figure 4:
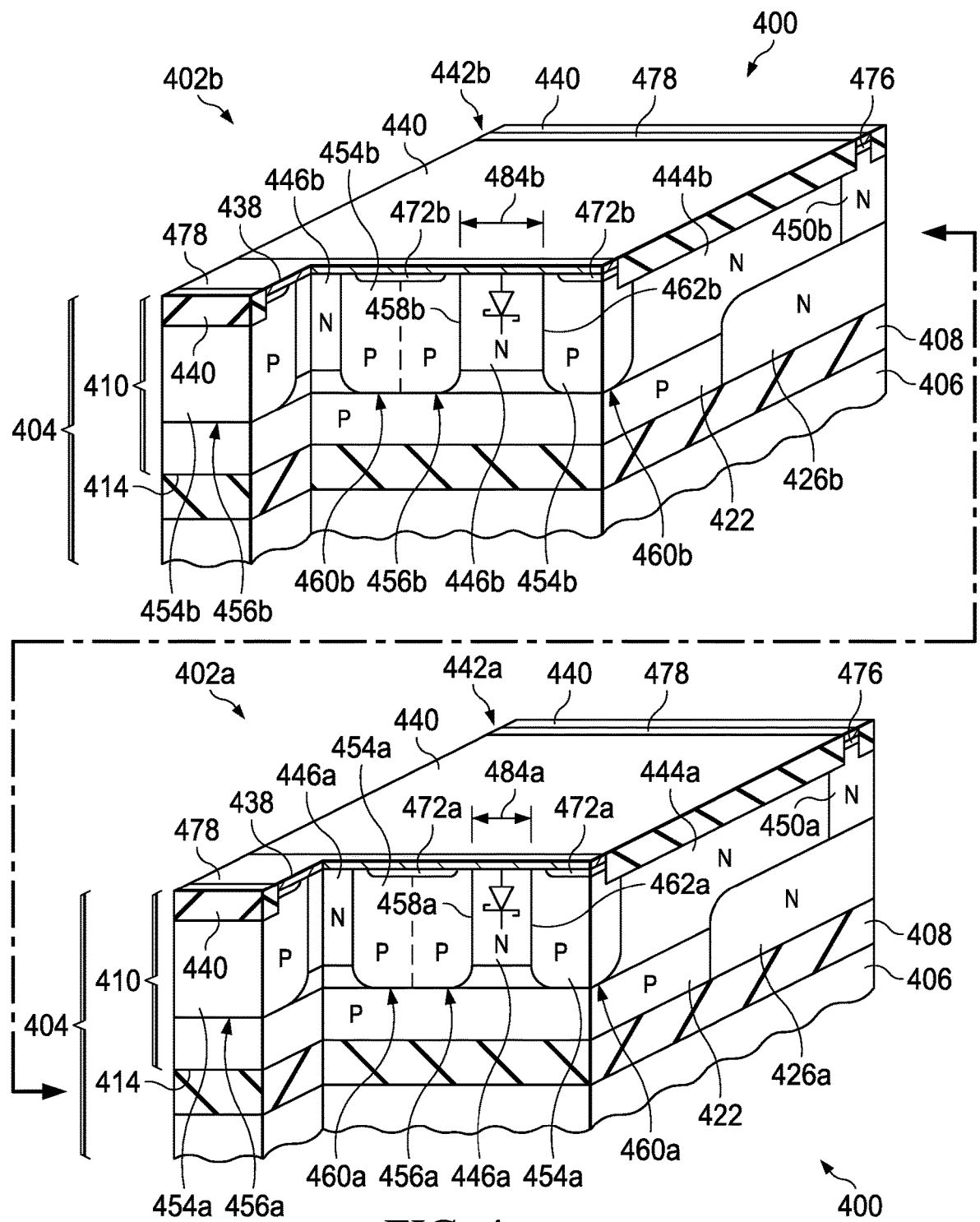
FIG. 4 is a cross section of an example semiconductor device including a first Schottky diode and a second Schottky diode on an SOI substrate.

FIG. 4 is a cross section of an example semiconductor device 400 including a first Schottky diode 402a and a second Schottky diode 402b on an SOI substrate 404. The semiconductor device 400 is formed on the SOI substrate 404. In this example, the SOI substrate 404 may include a handle wafer 406, a substrate dielectric layer 408 on the handle wafer 406, and a semiconductor layer 410 on the substrate dielectric layer 408. The semiconductor layer 410 has a bottom surface 414 at a boundary between the semiconductor layer 410 and the substrate dielectric layer 408, and a top surface 438, located opposite from the bottom surface 414.

The semiconductor device 400 may include a screen layer 422 in the semiconductor layer 410. The screen layer 422 has a first conductivity type, which is p-type in this example. The screen layer 422 may extend along portions of the bottom surface 414 under the first Schottky diode 402a and the second Schottky diode 402b. The screen layer 422 may have an average net concentration of first conductivity type dopants as disclosed in reference to the screen layer 222 of FIG. 2C. In an alternate version of this example, the screen layer 422 may have different average net concentrations of first conductivity type dopants under the first Schottky diode 402a and the second Schottky diode 402b.

The first Schottky diode 402a includes a first guard ring 454a in the semiconductor layer 410. The first guard ring 454a includes first guard ring segments 456a and second guard ring segments 460a. The second Schottky diode 402b includes a second guard ring 454b in the semiconductor layer 410. The second guard ring 454b includes third guard ring segments 456b and fourth guard ring segments 460b. The first guard ring 454a and the second guard ring 454b have the first conductivity type, which is p-type in this example. The first guard ring 454a and the second guard ring 454b may have average net concentrations of first conductivity type dopants as disclosed in reference to the guard ring 254 of FIG. 2H. The first guard ring 454a and the second guard ring 454b may have average net concentrations of first conductivity type dopants that are equal, as a result of implanting first conductivity type dopants into the semiconductor layer 410 concurrently in areas for the first guard ring 454a and the second guard ring 454b, followed by heating the semiconductor layer 410 to activate the implanted first conductivity type dopants. The screen layer 422 has an average net concentration of first conductivity type dopants lower than the first guard ring 454a and lower than the second guard ring 454b.

The first Schottky diode 402a includes a first drift region 444a in the semiconductor layer 410, located laterally adjacent to the first guard ring 454a. The first drift region 444a has a second conductivity type, opposite from the first conductivity type; in this example, the second conductivity type is n-type. The first Schottky diode 402a includes a first barrier region 446a in the semiconductor layer 410, laterally contacting the first drift region 444a. The first barrier region 446a has the second conductivity type. The first barrier region 446a has segments that extend between laterally opposing instances of the first guard ring segments 456a and the second guard ring segments 460a of the first guard ring 454a, contacting the first guard ring segments 456a on first lateral sides 458a of the first guard ring segments 456a, and contacting the second guard ring segment 460a on second lateral sides 462a of the second guard ring segments 460a. Corresponding instances of the first lateral sides 458a of the first guard ring segments 456a are located opposite from the second lateral sides 462a of the second guard ring segments 460a, across the segment of the first barrier region 446a that contacts the corresponding instances of the first lateral sides 458a of the first guard ring segments 456a. The corresponding instances of the first lateral sides 458a of the first guard ring segments 456a are separated by a first barrier region width 484a. The first barrier region width 484a may be selected to attain a desired value of a first forward voltage and a desired value of a first leakage current for the first Schottky diode 402a. Increasing the first barrier region width 484a results in a lower value of the first forward voltage and a higher value of the first leakage current, while decreasing the first barrier region width 484a results in a higher value of the first forward voltage and a lower value of the first leakage current.

The second Schottky diode 402b includes a second drift region 444b in the semiconductor layer 410, located laterally adjacent to the second guard ring 454b. The second drift region 444b has the second conductivity type. The second Schottky diode 402b includes a second barrier region 446b in the semiconductor layer 410, laterally contacting the second drift region 444b. The second barrier region 446b has the second conductivity type. The second barrier region 446b has segments that extend between laterally opposing instances of the third guard ring segments 456b and the fourth guard ring segments 460b of the second guard ring 454b, contacting the third guard ring segments 456b on third lateral sides 458b of the third guard ring segments 456b, and contacting the fourth guard ring segment 460b on fourth lateral sides 462b of the fourth guard ring segments 460b. Corresponding instances of the third lateral sides 458b are located opposite from the fourth lateral sides 462b of the fourth guard ring segments 460b, across the segment of the second barrier region 446b that contacts the corresponding instances of the third lateral sides 458b of the third guard ring segments 456b. The corresponding instances of the third lateral sides 458b and the fourth lateral sides 462b are separated by a second barrier region width 484b. The second barrier region width 484b may be selected to attain a desired value of a second forward voltage and a desired value of a second leakage current for the second Schottky diode 402b. Increasing the second barrier region width 484b results in a lower value of the second forward voltage and a higher value of the second leakage current, while decreasing the second barrier region width 484b results in a higher value of the second forward voltage and a lower value of the second leakage current.

The second barrier region width 484b is larger than the first barrier region width 484a, so that the second forward voltage is lower than the first forward voltage. The first guard ring 454a may be formed concurrently with the second guard ring 454b, and the first barrier region 446a may be formed concurrently with the second barrier region 446b, advantageously forming Schottky diodes with different forward voltages without requiring additional process steps or added process complexity.

The first Schottky diode 402a and the second Schottky diode 402b include metal silicide 478 on the first barrier region 446a and the second barrier region 446b, respectively. The metal silicide 478 on the first barrier region 446a provides a terminal of the first Schottky diode 402a. In the version of this example depicted in FIG. 4, in which the second conductivity type is n-type, the metal silicide 478 on the first barrier region 446a provides an anode of the first Schottky diode 402a. In alternate versions of this example, in which the second conductivity type is p-type, the metal silicide 478 on the first barrier region 446a provides a cathode of the first Schottky diode 402a. Similarly, the metal silicide 478 on the second barrier region 446b provides an anode of the second Schottky diode 402b of the example depicted in FIG. 4, and provides a cathode of the second Schottky diode 402b in alternate versions of this example, in which the second conductivity type is p-type.

The first Schottky diode 402a includes a first drift well 450a in the semiconductor layer 410, having the second conductivity type, contacting the first drift region 444a. The first Schottky diode 402a includes a first drift buried layer 426a in the semiconductor layer 410, having the second conductivity type, between the first drift well 450a and the bottom surface 414, extending laterally partway under the first drift region 444a. The second Schottky diode 402b includes a second drift well 450b in the semiconductor layer 410, having the second conductivity type, contacting the second drift region 444b. The second Schottky diode 402b includes a second drift buried layer 426b in the semiconductor layer 410, having the second conductivity type, between the second drift well 450b and the bottom surface 414, extending laterally partway under the second drift region 444b.

The first drift well 450a and the second drift well 450b may have average net concentrations of second conductivity type dopants as disclosed in reference to the drift well 250 of FIG. 2F. The first drift well 450a and the second drift well 450b may have equal average net concentrations of second conductivity type dopants, as a result of being formed concurrently. The first drift buried layer 426a and the second drift buried layer 426b may have average net concentrations of second conductivity type dopants as disclosed in reference to the drift buried layer 226 of FIG. 2E. The first drift buried layer 426a and the second drift buried layer 426b may have equal average net concentrations of second conductivity type dopants, as a result of being formed concurrently.

The semiconductor device 400 may include field oxide 440 on the semiconductor layer 410. The field oxide 440 may partially cover the first Schottky diode 402a and the second Schottky diode 402b, as depicted in FIG. 4. The semiconductor layer 410 may extend through the field oxide 440 in a first drift active area 442a located over the first drift well 450a, and in a second drift active area 442b located over the second drift well 450b. The semiconductor device 400 may include drift contact regions 476 having the second conductivity type in the first drift active area 442a and the second drift active area 442b, contacting the first drift well 450a and the second drift well 450b, respectively. The first Schottky diode 402a may include a first guard ring contact region 472a having the first conductivity type contacting the first guard ring 454a, and the second Schottky diode 402b may include a second guard ring contact region 472b having the first conductivity type contacting the second guard ring 454b, for example as disclosed in reference to FIG. 2I. The metal silicide 478 may extend onto the drift contact regions 476, the first guard ring contact region 472a, and the second guard ring contact region 472b. The first Schottky diode 402a and the second Schottky diode 402b may include field plates, not shown in FIG. 4, over the field oxide 440, for example as disclosed in reference to FIG. 2I.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A semiconductor device, comprising:
a semiconductor layer over a substrate; and
a diode, including:
a guard ring in the semiconductor layer, the guard ring having a first conductivity type, the guard ring including a first guard ring segment and a second guard ring segment;
a barrier region in the semiconductor layer, the barrier region having a second conductivity type, opposite from the first conductivity type, the barrier region extending between and touching the first guard ring segment and the second guard ring segment;
a well region having the second conductivity type surrounded by the guard ring;
a drift region having the second conductivity type in the semiconductor layer and extending from the barrier region toward the well region; and
a metal containing layer forming a Schottky barrier with the barrier region.

2. The semiconductor device of claim 1, the diode further including a drift buried layer having the second conductivity type in the semiconductor layer, the drift buried layer being located between the drift region and the substrate, and extending from the well region laterally along at least a portion of the drift region toward the barrier region.

3. The semiconductor device of claim 2, wherein the drift buried layer has a dopant density gradient such that a concentration of second conductivity type dopants decreases in a direction from the well region toward the barrier region over a lateral distance of at least twice a thickness of the drift buried layer.

4. The semiconductor device of claim 1, further comprising a screen layer in the semiconductor layer between the barrier region and the substrate, the screen layer having the first conductivity type and an average net concentration of first conductivity type dopants lower than the first guard ring segment and the second guard ring segment.

5. The semiconductor device of claim 1, wherein the metal containing layer includes metal silicide.

6. The semiconductor device of claim 1, wherein the substrate includes a substrate dielectric layer.

7. The semiconductor device of claim 1, wherein the metal containing layer is conductively coupled to the guard ring through a guard ring contact region having the first conductivity type, the guard ring contact region having an average net concentration of first conductivity type dopants higher than the guard ring.

8. The semiconductor device of claim 1, wherein the diode includes a plurality of fingers of the barrier region, nearest-neighbor fingers separated by a corresponding guard ring segment.

9. The semiconductor device of claim 1, wherein the substrate is a silicon-on-insulator (SOI) substrate.

10. The semiconductor device of claim 1, wherein the first conductivity type is P-type and the second conductivity type is N-type.

11. An integrated circuit, comprising:
a guard ring in a semiconductor layer over a substrate, the guard ring having a first conductivity type, the guard ring including a continuous closed path that encloses a central area, and further including guard ring projections having the first conductivity type extending from the guard ring into the enclosed central area;
a drift region in the central area of the semiconductor layer, the drift region having a second conductivity type opposite from the first conductivity type;
a barrier region having the second conductivity type that extends from the drift region between the guard ring projections; and
a metal-containing layer that forms a Schottky barrier with the barrier region.

12. The integrated circuit of claim 11, further comprising a drift buried layer having the second conductivity type in the semiconductor layer, the drift buried layer being located between the drift region and the substrate, and extending from a well region laterally along at least a portion of the drift region toward the barrier region.

13. The integrated circuit of claim 12, wherein the drift buried layer has a dopant density gradient such that a concentration of second conductivity type dopants decreases in a direction from the well region toward the barrier region over a lateral distance of at least twice a thickness of the drift buried layer.

14. The integrated circuit of claim 11, further comprising a screen layer in the semiconductor layer between the barrier region and the substrate, the screen layer having the first conductivity type and an average net concentration of first conductivity type dopants lower than the guard ring projections.

15. The integrated circuit of claim 11, wherein the metal-containing layer includes metal silicide.

16. The integrated circuit of claim 11, wherein the substrate includes a substrate dielectric layer.

17. The integrated circuit of claim 11, wherein the metal-containing layer is conductively coupled to the guard ring through a guard ring contact region having the first conductivity type, the guard ring contact region having an average net concentration of first conductivity type dopants higher than the guard ring.

18. The integrated circuit of claim 11, further comprising a plurality of fingers of the barrier region, nearest-neighbor fingers separated by a corresponding guard ring projection.

19. The integrated circuit of claim 11, wherein the substrate is a silicon-on-insulator (SOI) substrate.

20. The integrated circuit of claim 11, wherein the first conductivity type is P-type and the second conductivity type is N-type.

* * * * *